(12) United States Patent
Brandl et al.

(10) Patent No.: US 9,799,805 B2
(45) Date of Patent: Oct. 24, 2017

(54) OPTOELECTRONIC SEMICONDUCTOR CHIP AND HEADLAMP HAVING SUCH A SEMICONDUCTOR CHIP

(71) Applicant: OSRAM Opto Semiconductors GmbH, Regensburg (DE)

(72) Inventors: Michael Brandl, Mintraching (DE); Ulrich Frei, Obertraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 332 days.

(21) Appl. No.: 14/385,987

(22) PCT Filed: Mar. 8, 2013

(86) PCT No.: PCT/EP2013/054726
§ 371 (c)(1),
(2) Date: Sep. 17, 2014

(87) PCT Pub. No.: WO2013/139624
PCT Pub. Date: Sep. 26, 2013

(65) Prior Publication Data
US 2015/0049502 A1    Feb. 19, 2015

(30) Foreign Application Priority Data

Mar. 19, 2012  (DE) .................. 10 2012 102 301

(51) Int. Cl.
*H01L 33/50*     (2010.01)
*F21S 8/10*      (2006.01)
(Continued)

(52) U.S. Cl.
CPC .......... *H01L 33/507* (2013.01); *F21S 48/115* (2013.01); *F21S 48/1241* (2013.01);
(Continued)

(58) Field of Classification Search
CPC combination set(s) only.
See application file for complete search history.

(56) References Cited

U.S. PATENT DOCUMENTS 7,510,888 B2   3/2009  Guenther et al.
7,518,150 B2   4/2009  Aihara
(Continued)

FOREIGN PATENT DOCUMENTS

CN   101978516 A   2/2011
CN   102074634 A   5/2011
(Continued)

*Primary Examiner* — Kyoung Lee
*Assistant Examiner* — Ratisha Mehta
(74) *Attorney, Agent, or Firm* — Slater Matsil, LLP

(57) ABSTRACT

In at least one embodiment, the optoelectronic semiconductor chip includes a semiconductor layer sequence having an active layer configured to generate a primary radiation having a main wavelength less than 500 nm. The semiconductor chip contains a first conversion element configured to generate a first secondary radiation and a second conversion element configured to generate a second secondary radiation. The semiconductor layer sequence is divided into segments that can be controlled electrically independently of each other and that are arranged laterally adjacent to each other. The conversion elements are attached to main radiation sides of the segments. The first secondary radiation is colored light and the second secondary radiation white light.

18 Claims, 4 Drawing Sheets

(51) Int. Cl.
  *H01L 27/15* (2006.01)
  *H01L 33/58* (2010.01)
  *F21W 101/10* (2006.01)

(52) U.S. Cl.
  CPC ............ *F21S 48/215* (2013.01); *H01L 27/15* (2013.01); *H01L 33/58* (2013.01); *B60Q 2400/20* (2013.01); *F21W 2101/10* (2013.01); *H01L 33/504* (2013.01); *H01L 2924/0002* (2013.01)

(56) References Cited

U.S. PATENT DOCUMENTS

| | | | |
|---|---|---|---|
| 7,663,150 B2 | 2/2010 | Wirth et al. | |
| 7,922,374 B2 | 4/2011 | Schwab et al. | |
| 8,735,914 B2 | 5/2014 | Agatani et al. | |
| 2009/0009088 A1* | 1/2009 | Ito | H05B 33/0815 315/77 |
| 2009/0065826 A1 | 3/2009 | Hwang | |
| 2010/0219767 A1* | 9/2010 | Pumyea | H01L 27/153 315/291 |
| 2010/0301355 A1* | 12/2010 | Wegleiter | H01L 25/0753 257/88 |
| 2011/0025190 A1 | 2/2011 | Jagt | |
| 2011/0095320 A1 | 4/2011 | Hwang | |
| 2011/0215349 A1* | 9/2011 | An | H01L 33/08 257/89 |
| 2011/0233575 A1 | 9/2011 | Huang et al. | |
| 2011/0260176 A1 | 10/2011 | Onoe et al. | |
| 2012/0086038 A1 | 4/2012 | Hwang | |
| 2012/0193657 A1 | 8/2012 | von Malm et al. | |

FOREIGN PATENT DOCUMENTS

| | | |
|---|---|---|
| CN | 102201428 A | 9/2011 |
| CN | 102263098 A | 11/2011 |
| CN | 102265401 A | 11/2011 |
| DE | 102005033005 A1 | 1/2007 |
| DE | 102008046033 A1 | 4/2009 |
| DE | 102009058530 A1 | 8/2010 |
| DE | 102009021110 A1 | 11/2010 |
| DE | 102009037186 A1 | 2/2011 |
| EP | 1592074 A2 | 11/2005 |
| EP | 2161494 A1 | 3/2010 |
| EP | 2315273 A1 | 4/2011 |
| EP | 2390915 A1 | 11/2011 |
| JP | 2002324915 A | 11/2002 |
| JP | 2006245443 A | 9/2006 |
| JP | 201021001 A | 1/2010 |
| JP | 201034184 A | 2/2010 |
| JP | 201121062 A | 2/2011 |
| JP | 20124519 A | 1/2012 |
| WO | 0024064 A1 | 4/2000 |
| WO | 2009115998 A2 | 9/2009 |
| WO | 2010017790 A1 | 2/2010 |
| WO | 2010036364 A1 | 4/2010 |

* cited by examiner

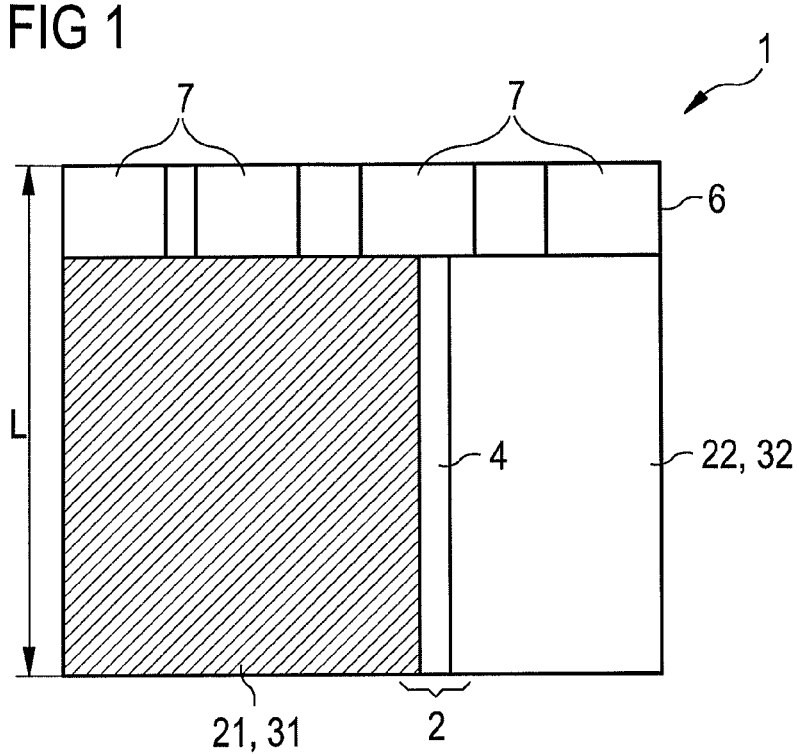
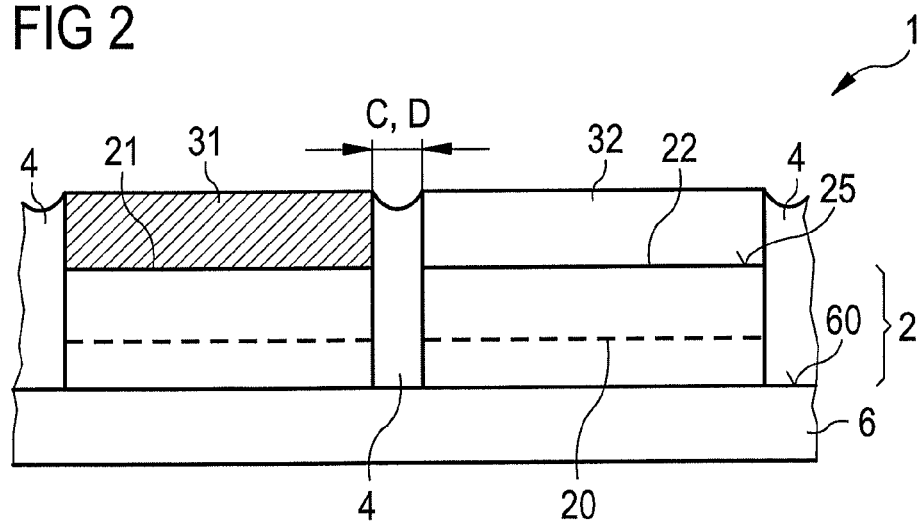

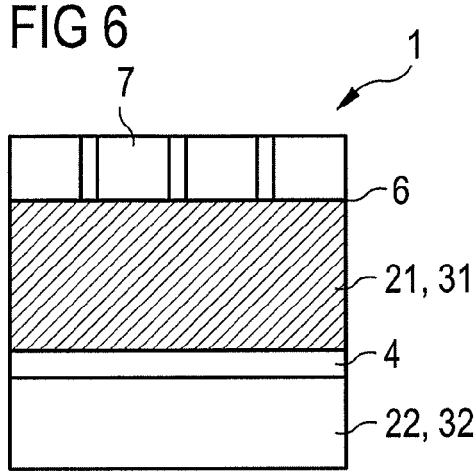
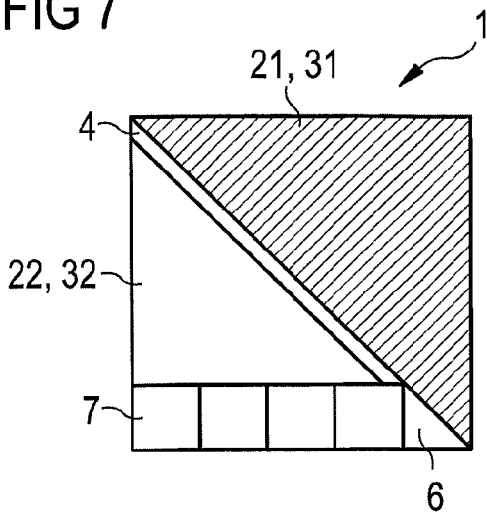
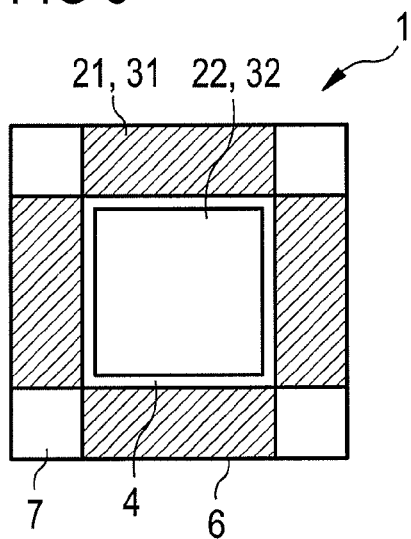
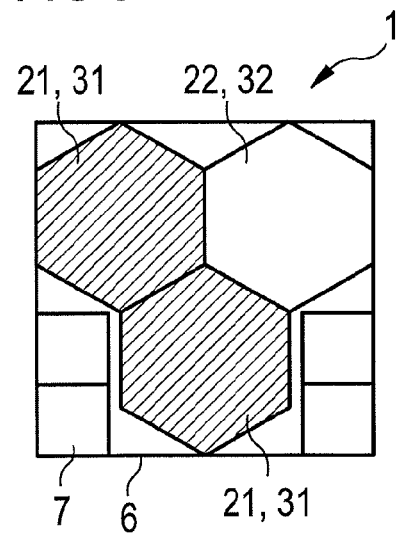
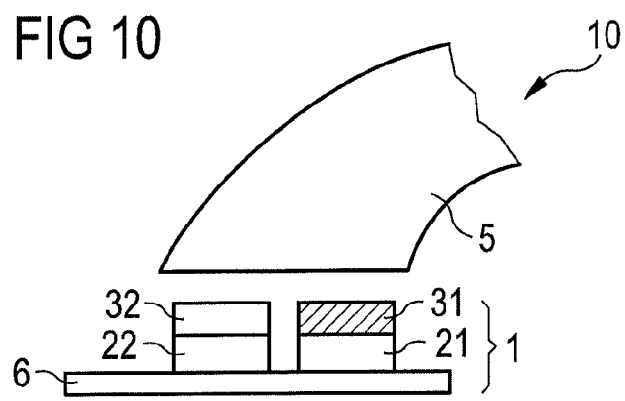

OPTOELECTRONIC SEMICONDUCTOR CHIP AND HEADLAMP HAVING SUCH A SEMICONDUCTOR CHIP

This patent application is a national phase filing under section 371 of PCT/EP2013/054726, filed Mar. 8, 2013, which claims the priority of German patent application 10 2012 102 301.8, filed Mar. 19, 2012, each of which is incorporated herein by reference in its entirety.

TECHNICAL FIELD

An optoelectronic semiconductor chip is specified. Furthermore, a headlamp having such an optoelectronic semiconductor chip is specified.

SUMMARY OF THE INVENTION

In accordance with at least an embodiment an optoelectronic semiconductor chip, as seen in plan view, comprises a plurality of color impressions alongside one another.

In accordance with at least one embodiment, the optoelectronic semiconductor chip comprises a semiconductor layer sequence. The semiconductor layer sequence includes an active layer for generating a primary radiation. The primary radiation is preferably ultraviolet light or blue light. In particular, a peak wavelength of the primary radiation is at wavelengths of less than 500 nm. The peak wavelength is that wavelength at which the highest spectral energy density is generated by the active layer.

In accordance with at least one embodiment, the semiconductor chip comprises one or a plurality of first conversion elements. The at least one first conversion element is designed for generating a first secondary radiation. For this purpose, the first conversion element converts part of the primary radiation or the entire primary radiation that passes into the first conversion element into the first secondary radiation. The first secondary radiation preferably has a greater wavelength than the primary radiation. It is possible that the primary radiation cannot pass through the first conversion element or cannot pass through the latter to a significant extent.

In accordance with at least one embodiment, the semiconductor chip comprises one or a plurality of second conversion elements. The at least one second conversion element is designed for generating a second secondary radiation by partial or complete wavelength conversion of the primary radiation passing to the second conversion element. In particular, part of the primary radiation can pass through the second conversion element, such that the second secondary radiation has a proportion of the primary radiation and a mixed radiation is involved. The second secondary radiation is particularly preferably white light. The term white light can mean that a color locus of the second secondary radiation in the CIE standard chromaticity diagram deviates from the black body curve by at most 0.1 or by at most 0.05 units.

In accordance with at least one embodiment, the semiconductor layer sequence is subdivided into at least two or more than two segments that are drivable electrically independently of one another. The segments are arranged laterally alongside one another and adjacent to one another, as seen in a plan view of a main radiation side of the semiconductor chip. The semiconductor layer sequence can be completely or only partly removed between adjacent segments. It is therefore possible that the individual segments are worked from the semiconductor layer sequence in an insular fashion or that the segments are all interconnected with one another by a partial region of the semiconductor layer sequence.

All the segments are therefore produced from the same, epitaxially grown semiconductor layer sequence. The semiconductor layer sequence extends, within the scope of the production tolerances, identically and with an unchanged layer construction and with an unchanged composition across all the segments. A spatial position of the finished produced segments relative to one another in the plane of the semiconductor layer sequence is preferably not changed in comparison with the semiconductor layer sequence that has not yet been segmented and has not yet been structured.

In accordance with at least one embodiment of the semiconductor chip, the conversion elements are fitted in each case on main radiation sides of the segments. Preferably, exactly one of the conversion elements is then assigned one-to-one to each of the segments. Furthermore, the conversion elements are preferably fitted on the segments in such a way that the conversion elements, as seen in a plan view of the main radiation side, do not overlap.

In accordance with at least one embodiment, the conversion elements are in indirect or direct contact with the main radiation sides of the segments. The conversion elements can therefore touch the semiconductor layer sequence. In particular, in the case of indirect contact, at most one connecting means is situated between the semiconductor material of the segments and the conversion elements in order to fix the conversion elements to the segments. The connecting means is, for example, an adhesive comprising a silicone.

In accordance with at least one embodiment, the first secondary radiation is colored light, in particular yellow and/or orange light. By way of example, a color locus of the first secondary radiation lies on the spectrum locus of the CIE standard chromaticity diagram with a tolerance of at most 0.07 units or of at most 0.05 units. A hue of the first secondary radiation lies, in particular, between 575 nm and 595 nm inclusive.

In at least one embodiment, the optoelectronic semiconductor chip comprises a semiconductor layer sequence having at least one active layer for generating a primary radiation having a peak wavelength of less than 500 nm. The semiconductor chip furthermore comprises at least one first conversion element for generating a first secondary radiation and at least one second conversion element for generating a second secondary radiation, wherein the secondary radiations are generated by partial or complete wavelength conversion of the primary radiation. The semiconductor layer sequence is subdivided into segments that are drivable electrically independently of one another and are arranged laterally adjacent to one another. The conversion elements are fitted on main radiation sides of the segments and can be in direct contact with the semiconductor layer sequence. The first secondary radiation is colored, in particular yellow, light and the second secondary radiation is white light.

By virtue of the fact that the semiconductor layer sequence is segmented, a distance between the regions in which the first or the second secondary radiation is emitted is only very small. Furthermore, what can be achieved by the segmentation is that a comparatively sharp color delimitation between the regions emitting the secondary radiation is possible.

In accordance with at least one embodiment, an area ratio of the first and second conversion elements, as seen in a plan view of the semiconductor layer sequence, is at least 0.25 or at least 0.5 or at least 0.75 or at least 1. Alternatively or additionally, the area ratio is at most 4 or at most 3 or at most 2.5. In particular, the area ratio of the first and second conversion elements is at least 1.25 and/or at most 2.25, such that the at least one first conversion element occupies a larger area than the at least one second conversion element.

In accordance with at least one embodiment, the area ratios of the first and second conversion elements are set in such a way that a quotient of the luminous flux of the first secondary radiation and the luminous flux of the second secondary radiation is at least 0.25 or at least 0.5 or at least 0.75. Alternatively or additionally, the quotient is at most 4 or at most 2 or at most 1.25. In other words, the secondary radiations then appear approximately equally bright to the human eye. The luminous flux is specified in lumens.

In accordance with at least one embodiment, the first and second conversion elements do not mutually touch one another. In other words, the first conversion elements can be spaced apart from the second conversion elements. If a plurality of the first conversion elements are present, then it is possible that the first conversion elements do not touch one another. The same can correspondingly apply to the second conversion elements. In other words, the conversion elements can be spaced apart from one another in pairs.

In accordance with at least one embodiment, an average distance between adjacent conversion elements is at most 150 µm or at most 110 µm or at most 75 µm or at most 40 µm. Alternatively or additionally, the average distance is at most 15% or at most 10% or at most 5% of an average edge length of the semiconductor chip and/or of the semiconductor layer sequence.

In accordance with at least one embodiment, an average distance between the segments differs from the average distance between the respectively associated conversion elements. In particular, the average distance between the segments can be less than the average distance between the associated conversion elements. By way of example, the average distance between the segments and the average distance between the respectively associated conversion elements differ from one another by at least 5% or 10% or 25% or 50%.

In accordance with at least one embodiment, an optical shield is situated between at least two of the conversion elements. The optical shield is preferably radiation-nontransmissive to the primary radiation and to the first secondary radiation and the second secondary radiation. Radiation-nontransmissive can mean that a transmittance for the primary radiation and for the secondary radiations is at most 20% or at most 10% or at most 3% or at most 1%. The at least one shield preferably optically separates the first conversion elements from the second conversion elements. By way of example, if a plurality of first conversion elements are present, then the optical shield can also be arranged in each case between adjacent first conversion elements; the same correspondingly applies in the case of a plurality of second conversion elements.

In accordance with at least one embodiment, the optical shield extends at least as far as sides of the conversion elements facing away from the semiconductor layer sequence, as seen from the semiconductor layer sequence. In other words, it is then possible that between adjacent conversion elements there is no direct line of sight not interrupted by the optical shield. In particular, it is possible that the at least one optical shield projects beyond the conversion elements, in a direction away from the semiconductor layer sequence.

In accordance with at least one embodiment, the segments, as seen in a plan view, have a rectangular or a square basic shape. It is likewise possible for the segments to have a triangular, a rhomboidal, a trapezoidal or a hexagonal basic shape. In particular, the segments can be embodied as regular hexagons or as equilateral triangles or as right-angled triangles. The associated conversion elements can each have the same basic shape as the segments.

In accordance with at least one embodiment, the segments have different surface areas, as seen in the plan view. This can likewise apply to the conversion elements. In this case, in particular, exactly one segment is provided for the exactly one first conversion element and exactly one segment is provided for the exactly one second conversion element.

In accordance with at least one embodiment, the semiconductor chip comprises a plurality of the first conversion elements. Preferably, one of the first conversion elements is then disposed downstream of each segment of a plurality of the segments. It is possible that these segments downstream of which in each case one of the first conversion elements is disposed are shaped identically, as seen in plan view, just like the first conversion elements. The same can correspondingly apply to the second conversion elements. In particular, the first conversion elements and the second conversion elements, and also the associated segments, can be identically shaped in each case.

In accordance with at least one embodiment, as seen in a plan view of the main radiation side, a plurality of the first conversion elements are arranged around the at least one second conversion element. In this case, the first conversion elements can surround the second conversion element in a framelike manner or in the shape of a circumcircle. It is not absolutely necessary for the first conversion elements to form a line closed around one or a plurality of the second conversion elements. Analogously, a plurality of the second conversion elements can be arranged around one or a plurality of the first conversion elements.

In accordance with at least one embodiment, one of the conversion elements is assigned to a plurality of the segments. Likewise, a plurality of the conversion elements can be assigned to one of the segments.

Furthermore, a headlamp is specified. The headlamp comprises at least one optoelectronic semiconductor chip as specified in connection with one or more of the embodiments mentioned above. Therefore, features of the headlamp are also disclosed for the semiconductor chip, and vice versa.

In at least one embodiment, the headlamp comprises at least one optical unit disposed downstream of the at least one optoelectronic semiconductor chip. Disposed downstream can mean that at least 70% or at least 85% or at least 95% of the radiation generated by the semiconductor chip passes to and/or into the optical unit. In other words, the radiation generated by the semiconductor chip passes completely or substantially completely to or into the optical unit.

In accordance with at least one embodiment of the headlamp, the optical unit comprises one or a plurality of optical waveguides or the optical unit is an optical waveguide. By at least one such optical waveguide, it is possible for the radiation generated by the semiconductor chip to be guided to a light exit surface of the headlamp.

In accordance with at least one embodiment the optical waveguide is disposed downstream of all the segments of the semiconductor chip jointly. In other words, the optical waveguide then covers both the first conversion elements and the second conversion elements and is designed to take up and guide the first and also the second secondary radiation. This is made possible, in particular, by the small distance between the segments and the conversion elements.

What can be achieved thereby is that the first and the second secondary radiation can be coupled out at the same light exit surface of the headlamp. As an alternative thereto, it is possible for a plurality of optical waveguides to be assigned to one of the semiconductor chips, wherein at least one of the optical waveguides can extend over a plurality of the segments.

In accordance with at least one embodiment, the headlamp comprises a plurality of the semiconductor chips and/or a plurality of the optical waveguides. In that case, exactly one of the optical waveguides is preferably assigned to each of the semiconductor chips.

In accordance with at least one embodiment, the headlamp is provided for a motor vehicle such as an automobile. The at least one semiconductor chip is then designed as a light source both for a turn signal and for a daytime running light. The first secondary radiation and the second secondary radiation then have the color loci and intensities prescribed for these purposes. Alternatively or additionally, a so-called po light can be involved, for example, for service vehicles of, for instance, the police. It is possible for the headlamp to comprise additional light-emitting diode chips, which are situated outside the optical unit or downstream of which the optical unit is not disposed. Influences of the optical unit can be compensated for by such additional light-emitting diode chips.

In this case, the term headlamp does not necessarily rule out the fact that the headlamp comprises only the daytime running light and a turn signal and/or a brake light and the light source provided for travel at night is realized by a separate component.

An optoelectronic semiconductor chip described here and a headlamp described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

BRIEF DESCRIPTION OF THE DRAWINGS

In the figures:

FIGS. 1 to 9 show schematic illustrations of exemplary embodiments of optoelectronic semiconductor chips described here, FIG. 10 shows a schematic sectional illustration of one exemplary embodiment of a headlamp described here.

DETAILED DESCRIPTION OF ILLUSTRATIVE EMBODIMENTS

Figure 3:
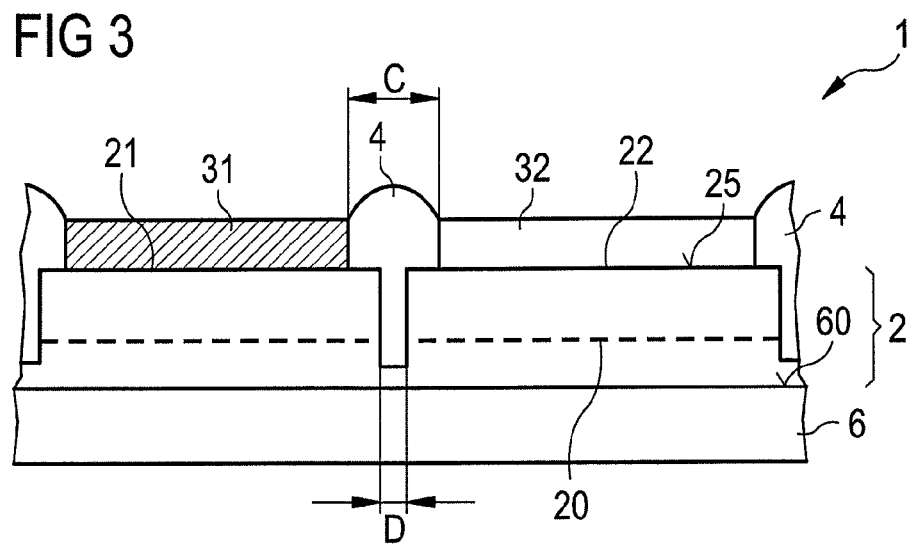

FIG. 1 shows an exemplary embodiment of an optoelectronic semiconductor chip 1 in a schematic plan view. The semiconductor chip 1 comprises a semiconductor layer sequence 2, which is subdivided into two segments 21, 22. The segments 21, 22 are arranged laterally adjacent to one another and are drivable electrically independently of one another. For the electrical driving, the semiconductor chip 1 comprises four electrical contact locations 7. The contact locations 7 are arranged along an edge of the semiconductor chip 1. The contact locations 7 can be, for example, soldering contacts, bonding pads or plug contacts.

In contrast to the illustration, the contact locations 7 can also be situated at a rear side of the carrier 6 facing away from the semiconductor layer sequence 2. Bonding wires can be fitted to the contact locations 7.

A first conversion element 31 and a second conversion element 32 are fitted on the segments 21, 22. The first conversion element 31 is identified by a hatching, as also in all the other figures. The conversion elements 31, 32 are assigned one-to-one to the segments 21, 22. The conversion elements 31, 32 are also spaced apart laterally from one another.

During the operation of the semiconductor chip 1, preferably blue light is generated in the semiconductor layer sequence 2. Said blue light constitutes a primary radiation. From this primary radiation, the first conversion element 31 generates a first secondary radiation, which is colored light, preferably yellow light. By the second conversion element 32, a second secondary radiation is generated from part of the primary radiation. The second secondary radiation, in particular together with a remainder of the primary radiation, is white light. An area ratio of the conversion elements 31, 32, as seen in plan view, is, for example, approximately 2:1. An edge length L of the semiconductor chip 1 is, for example, between 400 µm and 2500 µm inclusive, in particular approximately 1000 µm. In FIG. 1, the semiconductor chip 1 comprises exactly two of the conversion elements 31, 32. In a departure from the illustration, it is possible for more than two of the conversion elements 31, 32, also to be present; the same correspondingly applies to FIGS. 2 to 7 and 10 in an analogous way. As also in all of the other exemplary embodiments, exactly one of the conversion elements 31, 32 is preferably disposed downstream of each of the segments 21, 22. A material composition of the conversion elements 31, 32 preferably does not vary in a lateral direction.

Optionally, an optical shield 4 is situated between the conversion elements 31, 32. As a result of the optical shield 4, no first secondary radiation passes into the second conversion element 32, and vice versa with regard to the second secondary radiation. The optical shield 4 is therefore non-transmissive to the first secondary radiation and the second secondary radiation and to the primary radiation.

By way of example, the optical shield 4 is formed by a potting comprising a matrix material and particles embedded therein. The matrix material can be a silicone or a silicone-epoxy hybrid material. The particles in the shield 4 are, for example, reflective particles, for instance composed of titanium dioxide, or absorbent particles, for instance composed of carbon black. It is furthermore optionally possible, as also in all of the other exemplary embodiments, for a reflective or absorbent layer (not depicted here) to be applied at a side of the shield 4 which faces away from the semiconductor layer sequence 2. Such a preferably reflective layer can alternatively or additionally also be applied at side surfaces of the segments 21, 22 and/or of the conversion elements 31, 32.

FIG. 2 shows a schematic sectional illustration of the semiconductor chip 1. The semiconductor layer sequence 2 subdivided into the segments 21, 22 is fitted on a carrier top side 60 of a carrier 6. The carrier 6 preferably differs from a growth substrate of the semiconductor layer sequence 2. However, the carrier 6 can also be a growth substrate such as sapphire or SiC. The semiconductor layer sequence 2 comprises at least one active layer 20, depicted as a dashed line. For subdivision into the segments 21, 22, the semiconductor layer sequence 2 is divided completely, in a direction perpendicular to the carrier top side 60. A relative position of the segments 21, 22 with respect to one another, in comparison with the relative positions at a growth substrate for the semiconductor layer sequence 2, is unchanged.

The conversion elements 31, 32 are fitted directly to the semiconductor layer sequence 2, for example, by a printing method. As an alternative thereto, it is possible for the conversion elements 31, 32 to be manufactured separately and to be embodied as ceramic laminae or as silicone laminae, one or a plurality of conversion means then being introduced into said laminae. A connecting means, in particular a silicone-based adhesive, is then situated between the conversion elements 31, 32 and the semiconductor layer sequence 2. The connecting means is not illustrated in the figures.

The conversion elements 31, 32 are congruent with the segments 21, 22 within the scope of the production tolerances. A distance C between the adjacent conversion elements 31, 32, in a direction parallel to the carrier top side 60, corresponds to a distance D between the segments 21, 22.

The optical shield 4 extends as far as sides of the conversion elements 31, 32 facing away from the carrier 6 and substantially completely fills a gap between the segments 21, 22 and between the conversion elements 31, 32. At a side facing away from the carrier 6, the shield 4 is shaped concavely, for example.

In the case of the sectional illustration of the semiconductor chip 1 in accordance with FIG. 3, the semiconductor layer sequence 2 is not completely severed, in a direction perpendicular to the carrier 6. The individual segments 21, 22 are monolithically interconnected by a material of the semiconductor layer sequence 2. The at least one active layer 20 does not extend continuously over the segments 21, 22. In order to simplify the illustration, as also in all of the other exemplary embodiments, electrical lines and electrical connection devices for energizing the individual segments 21, 22 are not depicted.

In accordance with FIG. 3, the segments 21, 22 have a larger basic area than the associated conversion elements 31, 32. The distance D between the segments 21, 22 is less than the distance C between the conversion elements 31, 32. The optical shield 4 projects beyond the conversion elements 31, 32, in a direction away from the carrier 6.

In a departure from the illustration in FIG. 3, the distance D between the segments 21, 22 can also be greater than the distance C between the conversion elements 31, 32. The conversion elements 31, 32 then project laterally beyond the segments 21, 22.

In a further departure from FIG. 3, the shield 4 can also be situated only or substantially only between the conversion elements 31, 32. The region between the segments 21, 22 is then either evacuated or gas-filled or provided with a further filling (not depicted), which can be formed from a different material than the shield 4. Such a filling can also only partly fill the region between the segments 21, 22, in the same way as may be the case in the case of the shield 4 between the conversion elements 31, 32 and/or the segments 21, 22. In that case, the shield 4 and/or the filling are/is a coating, for example, which is applied at side surfaces of the segments 21, 22 and/or of the conversion elements 31, 32 and there is a gap between adjacent fillings and/or shields 4.

As also in all of the other exemplary embodiments, it is possible for a protective layer (not depicted) or a potting (not depicted) to be situated at the sides of the conversion elements 31, 32 and/or of the optical shield 4 which face away from the carrier 6.

FIGS. 4 to 9 show further exemplary embodiments of the optoelectronic semiconductor chip 1 in schematic plan views. In accordance with FIGS. 4 and 5, the semiconductor chips 1 in each case comprise three of the contact locations 7. One of the contact locations 7 is shaped as a common electrode for the segments 21, 22. The same can correspondingly also be the case in all of the other exemplary embodiments.

Figure 4:
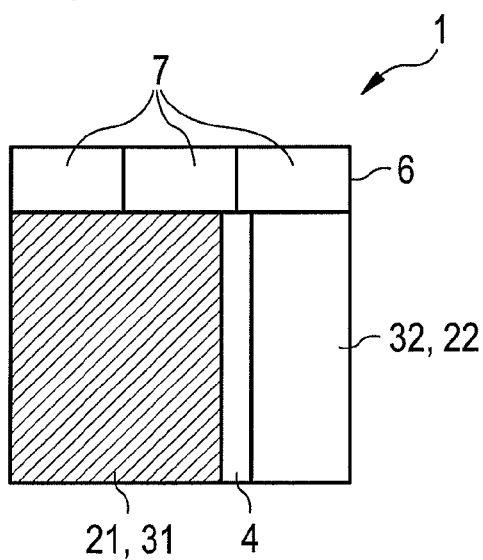
Figure 5:
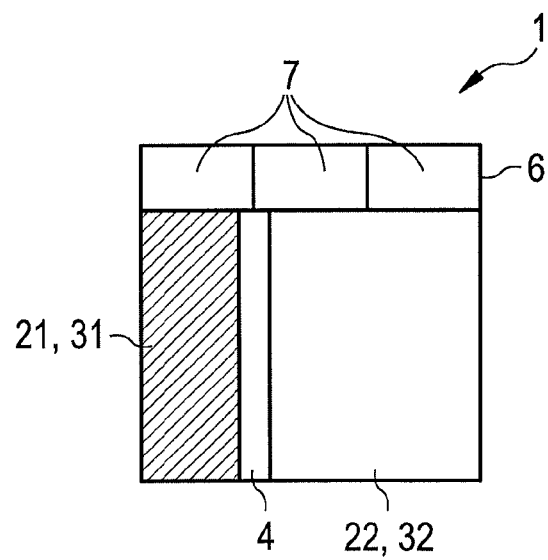

An area ratio of the conversion elements 31, 32 is approximately 2:1 in accordance with FIG. 4 and approximately 1:2 in accordance with FIG. 5. The conversion elements 31, 32 and the segments 21, 22 are shaped in each case as rectangles having different surface areas, as seen in plan view. Longitudinal directions of the conversion elements 31, 32 are oriented perpendicularly to a longitudinal direction of the contact locations 7. In a departure therefrom, the longitudinal directions of the conversion elements 31, 32 and of the contact locations 7 run parallel to one another in FIG. 6.

In accordance with FIG. 7, the conversion elements 31, 32 are shaped as right-angled triangles having different surface areas as seen in plan view. The optical shield 4 runs diagonally over the semiconductor chip 1, unlike in FIGS. 4 to 6, where the optical shield 4 is oriented parallel to edges of the semiconductor chip 1.

In the case of the exemplary embodiment in accordance with FIG. 8, a central second conversion element 32 is fitted on the segment 22. The optionally present shield 4 surrounds the second conversion element 32 in a frame-tight fashion. Four elongated first conversion elements 31 fitted along the edges of the semiconductor chip 1 are fitted around the second conversion element 32, and surround the second conversion element 32 substantially all around. The contact locations 7 are fitted at the four corners of the semiconductor chip 1. It is possible for contact locations 7 to be situated only at three corners, in contrast to the illustration depicted.

In accordance with FIG. 9, the segments 21, 22 are in each case shaped identically as regular hexagons. First conversion elements 31 are fitted on two of the segments 21. One of the segments 22 is provided with the second conversion element 32.

The segments 21 with the first conversion elements 31 are preferably electrically connected in parallel, but can also be drivable individually independently of one another. It is possible for the conversion elements 31, 32 to touch one another. In contrast to the illustration shown, the two conversion elements 31 can also be embodied integrally. In contrast to the illustration depicted, the optical shield 4 can be present in the exemplary embodiment in accordance with FIG. 9.

FIG. 10 shows one exemplary embodiment of a headlamp 10 in a schematic sectional illustration. The headlamp 10 comprises an optoelectronic semiconductor chip 1, in particular as illustrated in connection with FIGS. 1 to 9. An optical unit 5 in the form of an optical waveguide is disposed downstream of the semiconductor chip 1. The optical unit 5 extends over all of the segments 21, 22 and thus also over all of the conversion elements 31, 32. The optical unit 5 is designed to take up and guide both the first secondary radiation and the second secondary radiation. Further optical components possibly present are not depicted in FIG. 10 in order to simplify the illustration.

Figure 11A:
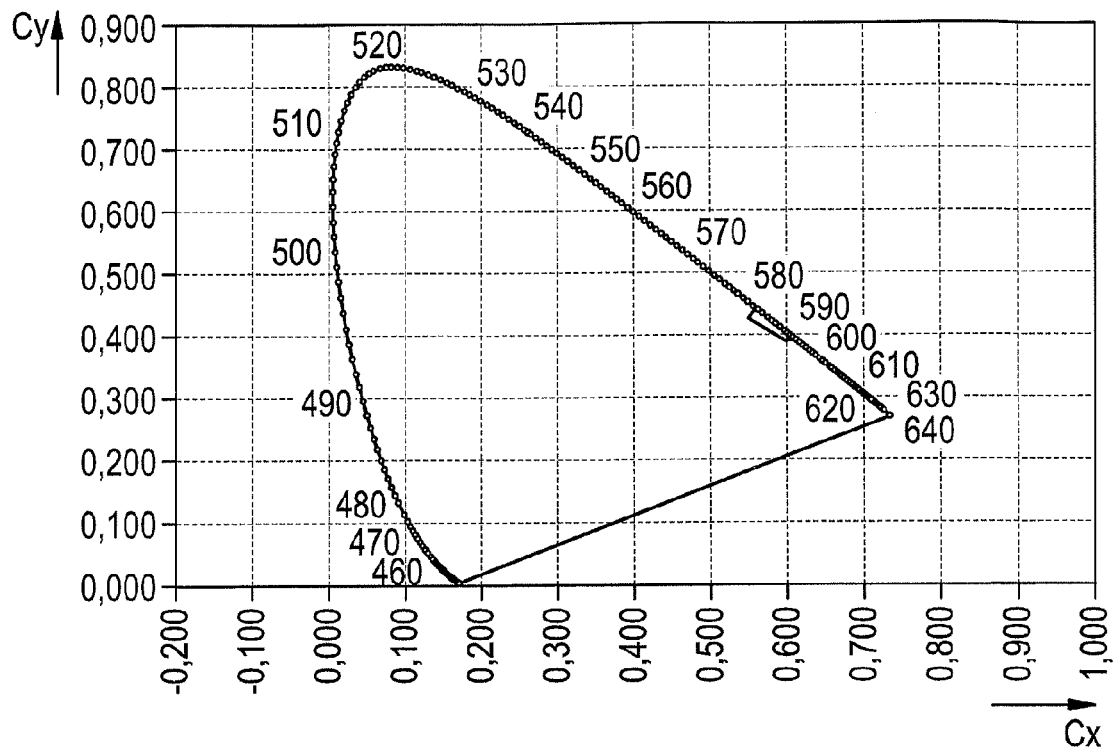
FIGS. 11A and 11B show an excerpt from the CIE standard chromaticity diagram for the first secondary radiation.
Figure 11B:
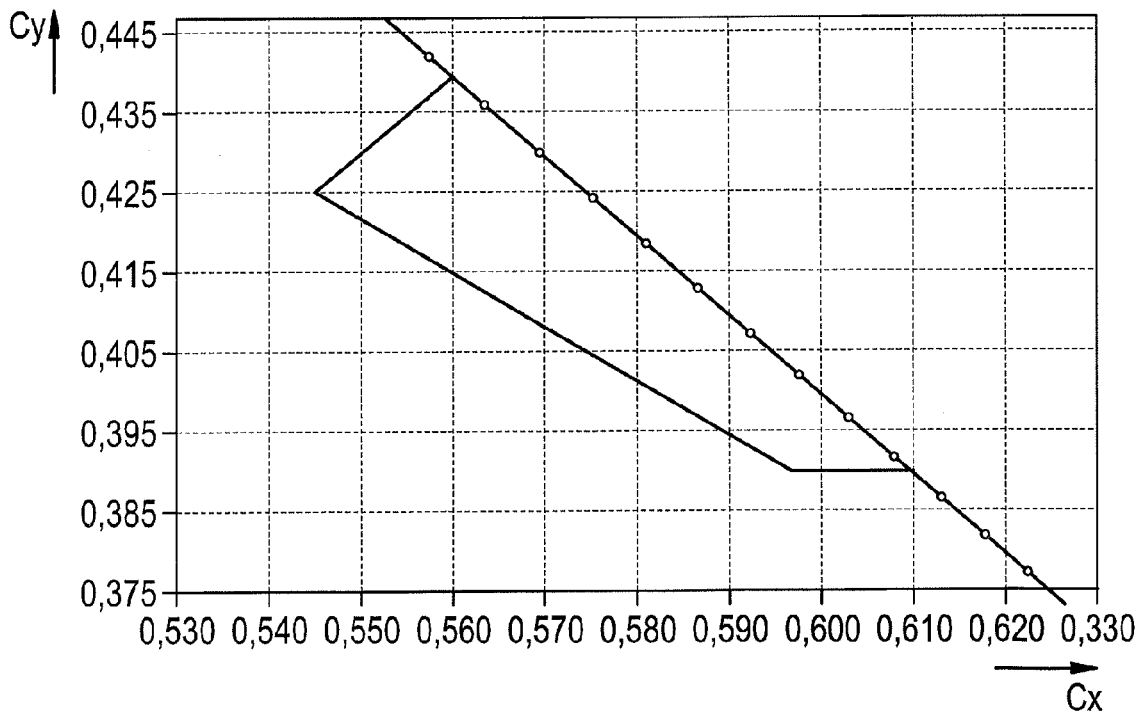

FIG. 11B shows an excerpt from the CIE standard chromaticity diagram, see FIG. 11A. The color locus of the first secondary radiation preferably lies in the framed region, that is to say in a rectangle spanned by the four color loci having the coordinates (0.545; 0.425), (0.597; 0.390), 0.610; 0.390) and (0.560; 0.440).

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
a semiconductor layer sequence having at least one active layer for generating a primary radiation having a peak wavelength of less than 500 nm;
at least one first conversion element for generating a first secondary radiation by wavelength conversion of the primary radiation; and
at least one second conversion element for generating a second secondary radiation by wavelength conversion of the primary radiation,
wherein the semiconductor layer sequence is subdivided into segments that are drivable electrically independently of one another and arranged laterally adjacent to one another, wherein each of the segments are formed from the same semiconductor layer sequence, and wherein the semiconductor layer sequence is at least partially removed between the segments,
wherein the at least one first conversion element and the at least one second conversion element are fitted on main radiation sides of the segments, and
wherein the first secondary radiation is colored light and the second secondary radiation is white light.

2. The optoelectronic semiconductor chip according to claim 1,
wherein an area ratio of the first and second conversion elements, as seen in a plan view of the semiconductor layer sequence, is between 0.25 and 4 inclusive,
wherein the first secondary radiation is yellow and/or orange light, and
wherein an average distance between segments differs from the average distance between the conversion elements.

3. The optoelectronic semiconductor chip according to claim 2, wherein the average distance between the segments is less than the average distance between the associated conversion elements.

4. The optoelectronic semiconductor chip according to claim 1, wherein the conversion elements do not mutually touch one another and an average distance between adjacent conversion elements is at most 150 μm.

5. The optoelectronic semiconductor chip according to claim 1, wherein the average distance between the segments is less than the average distance between the conversion elements.

6. The optoelectronic semiconductor chip according to claim 1, wherein an optical shield is situated at least between the conversion elements, said shield being radiation-non-transmissive to the primary radiation and to the first secondary radiation and the second secondary radiation.

7. The optoelectronic semiconductor chip according to claim 6, wherein the shield extends at least as far as sides of the conversion elements facing away from the semiconductor layer sequence, in a direction away from the semiconductor layer sequence.

8. The optoelectronic semiconductor chip according to claim 1, wherein the segments, as seen in plan view, are rectangles or triangles having different surface areas.

9. The optoelectronic semiconductor chip according to claim 1, which comprises a plurality of first conversion elements, and wherein in each case one of the first conversion elements is disposed downstream of a plurality of the segments, wherein said segments, as seen in plan view, are shaped identically.

10. The optoelectronic semiconductor chip according to claim 1, wherein, as seen in plan view, a plurality of the first conversion elements are arranged around the at least one second conversion element.

11. A headlamp comprising at least one optoelectronic semiconductor chip according to claim 1 and comprising at least one optical unit, wherein the at least one optical unit is disposed downstream of the semiconductor chip.

12. The headlamp according to claim 11,
wherein the optical unit comprises an optical waveguide or is an optical waveguide, and
wherein the optical waveguide is disposed downstream of all the segments jointly.

13. The headlamp according to claim 11, which is provided for a motor vehicle, and wherein the semiconductor chip is a light source both for a turn signal and for a daytime running light.

14. An optoelectronic semiconductor chip comprising:
a semiconductor layer sequence having at least one active layer for generating a primary radiation having a peak wavelength of less than 500 nm;
at least one first conversion element for generating a first secondary radiation by wavelength conversion of the primary radiation; and
at least one second conversion element for generating a second secondary radiation by wavelength conversion of the primary radiation,
wherein the semiconductor layer sequence is subdivided into segments that are drivable electrically independently of one another and arranged laterally adjacent to one another, wherein each of the segments are formed from the same semiconductor layer sequence, and wherein the semiconductor layer sequence is at least partially removed between the segments,
wherein the conversion elements are fitted on main radiation sides of the segments,
wherein the first secondary radiation is colored light and the second secondary radiation is white light,
wherein an average distance between segments differs from the average distance between the conversion elements,
wherein an optical shield is situated at least between the conversion elements, the shield being radiation-non-transmissive to the primary radiation and to the first secondary radiation and the second secondary radiation, and
wherein the shield extends at least as far as sides of the conversion elements facing away from the semiconductor layer sequence, in a direction away from the semiconductor layer sequence.

15. The optoelectronic semiconductor chip according to claim 14, wherein the shield is shaped concavely at a side facing away from a carrier.

16. The optoelectronic semiconductor chip according to claim 14, wherein the shield is shaped in a convex manner at a side facing away from a carrier.

17. The optoelectronic semiconductor chip according to claim 1, further comprising an optical shield disposed in a gap between adjacent ones of the segments formed by removal of the semiconductor layer sequence between the segments, wherein the optical shield covers lateral faces of the adjacent ones of the segments and lateral faces of adjacent ones of the at least one first conversion element and the at least one second conversion element, wherein the optical shield is shaped in a convex manner at a side facing away from the semiconductor layer sequence.

18. The optoelectronic semiconductor chip according to claim 16, wherein the optical shield extends into a gap between adjacent ones of the segments formed by removal of the semiconductor layer sequence between the segments, wherein the optical shield covers lateral faces of the adjacent ones of the segments and lateral faces of adjacent ones of the at least one first conversion element and the at least one second conversion element.

* * * * *

UNITED STATES PATENT AND TRADEMARK OFFICE
CERTIFICATE OF CORRECTION

PATENT NO. : 9,799,805 B2  
APPLICATION NO. : 14/385987  
DATED : October 24, 2017  
INVENTOR(S) : Michael Brandl et al.

Page 1 of 1

It is certified that error appears in the above-identified patent and that said Letters Patent is hereby corrected as shown below:

In the Claims

In Column 9, Line 50, Claim 5, delete "claim 1" and insert --claim 4--.

Signed and Sealed this  
Thirtieth Day of January, 2018

Joseph Matal  
*Performing the Functions and Duties of the*  
*Under Secretary of Commerce for Intellectual Property and*  
*Director of the United States Patent and Trademark Office*